US011479006B2

(12) United States Patent
Lee (10) Patent No.: US 11,479,006 B2
(45) Date of Patent: Oct. 25, 2022

(54) JUICER HAVING IMPROVED JUICING PERFORMANCE

(71) Applicant: Kwanghui Lee, Busan (KR)

(72) Inventor: Mun Hyun Lee, Nonsan-si (KR)

(73) Assignee: Kwanghui Lee, Busan (KR)

( * ) Notice: Subject to any disclaimer, the term of this patent is extended or adjusted under 35 U.S.C. 154(b) by 973 days.

(21) Appl. No.: 16/313,333

(22) PCT Filed: May 18, 2018

(86) PCT No.: PCT/KR2018/005692
§ 371 (c)(1),
(2) Date: Dec. 26, 2018

(87) PCT Pub. No.: WO2018/216960
PCT Pub. Date: Nov. 29, 2018

(65) Prior Publication Data
US 2019/0168476 A1     Jun. 6, 2019

(30) Foreign Application Priority Data

May 25, 2017 (KR) ......................... 10-2017-0064602

(51) Int. Cl.
*B30B 9/16* (2006.01)
*A47J 19/02* (2006.01)
*H01L 41/09* (2006.01)

(52) U.S. Cl.
CPC .............. *B30B 9/16* (2013.01); *A47J 19/025* (2013.01); *H01L 41/09* (2013.01)

(58) Field of Classification Search
CPC .......... A47J 19/025; A47J 19/00; A47J 19/02; A47J 19/06; A47J 19/027; A47J 43/04;
(Continued)

(56) References Cited

U.S. PATENT DOCUMENTS

| 4,363,265 A | * | 12/1982 | Tanioka | A47J 19/025 99/513 |
| 4,440,074 A | * | 4/1984 | Ihara | A47J 19/025 100/145 |
| 5,163,865 A | * | 11/1992 | Smith | A22C 25/18 83/956 |

(Continued)

FOREIGN PATENT DOCUMENTS

| CA | 2099448 A | * | 12/1994 | ............... A23N 1/00 |
| EP | 1955832 A1 | * | 8/2008 | ............... B26B 7/00 |

(Continued)

OTHER PUBLICATIONS

International Search Report for PCT/KR2018/005692 dated Oct. 8, 2018 from Korean Intellectual Property Office.

*Primary Examiner* — Tu B Hoang
*Assistant Examiner* — Vy T Nguyen
(74) *Attorney, Agent, or Firm* — Paratus Law Group, PLLC (57) ABSTRACT

A juicer having improved juicing performance, including: a housing in which a motor is built in; a screw housing detachably coupled to the housing; and a driving screw exposed to one side of the housing and received in the screw housing so as to rotate by being coupled to a driving shaft rotatably driven by the motor. The driving screw includes: a driving screw main body in which an installation groove opened toward the housing is formed; one or more piezoelectric element provided in the installation groove of the driving screw main body; and a contact terminal electrically connected to the piezoelectric element and electrically contacting a contact electrode provided in the housing.

7 Claims, 6 Drawing Sheets

(58) Field of Classification Search
CPC ....... A47J 43/046; A47J 43/0716; B30B 9/16; H01L 41/09; A23N 1/00; H01R 2103/00; H01R 24/564
USPC ......... 99/510, 495, 503, 504, 492, 513, 451, 99/509; 426/238, 231, 518; 29/828; 439/277; 83/956, 13, 371; 366/205, 319, 366/88
See application file for complete search history.

(56) References Cited

U.S. PATENT DOCUMENTS

| | | | |
|---|---|---|---|
| 2004/0134327 A1* | 7/2004 | Capodieci | A21C 11/10 83/13 |
| 2009/0064875 A1* | 3/2009 | Trovinger | A23N 1/02 99/503 |

FOREIGN PATENT DOCUMENTS

| | | | | |
|---|---|---|---|---|
| GB | 2497083 A | * | 6/2013 | ......... A47J 43/0716 |
| JP | 2004351912 A | * | 12/2004 | |
| KR | 20-1996-0006801 U | | 3/1996 | |
| KR | 20-2000-0001413 U | | 1/2000 | |
| KR | 10-2008-0028080 A | | 3/2008 | |
| KR | 10-2012-0039179 A | | 4/2012 | |
| KR | 10-2016-0068098 A | | 6/2016 | |
| WO | WO 2013/159665 A1 | | 10/2013 | |
| WO | WO-2013143430 A1 | * | 10/2013 | ............ A47J 43/046 |
| WO | WO-2016089108 A1 | * | 6/2016 | ............ A47J 19/00 |
| WO | WO-2017082350 A1 | * | 5/2017 | ................ H02N 2/00 |

* cited by examiner

JUICER HAVING IMPROVED JUICING PERFORMANCE

CROSS REFERENCE TO PRIOR APPLICATIONS

This application is a National Stage Patent Application of PCT International Patent Application No. PCT/KR2018/005692 (filed on May 18, 2018) under 35 U.S.C. § 371, which claims priority to Korean Patent Application No. 10-2017-0064602 (filed on May 25, 2017), which are all hereby incorporated by reference in their entirety.

BACKGROUND

The present disclosure relates to a juicer having improved juicing performance, and more particularly, to a juicer having improved juicing performance, which has a piezoelectric element to sufficiently pressurize the juice between a screw housing and a driving screw by the piezoelectric effect of the piezoelectric element.

Figure 1:
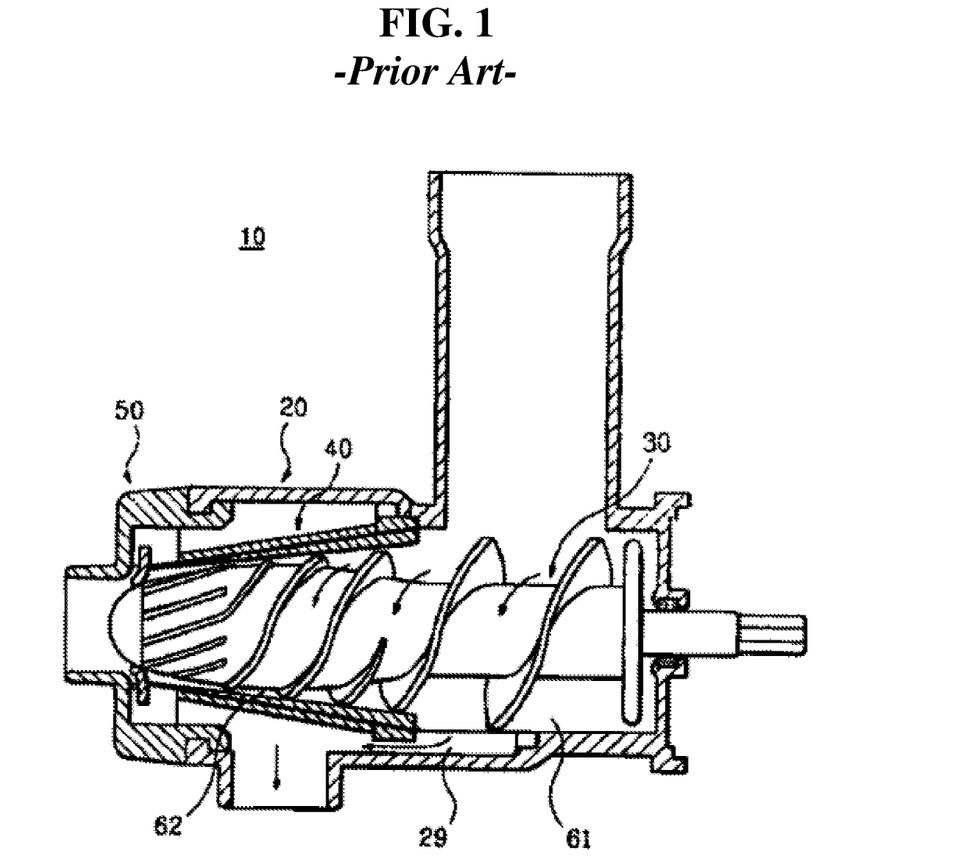
FIG. 1 is a cross-sectional diagram illustrating a conventional juicer.

As illustrated in FIG. 1, a conventional juicer 10 is composed of a main body (not illustrated) having a hollow body and a motor, a housing 20, a juice roller part 30, a juice bottle 40, a discharge passage 29, and a housing cap 50.

The housing 20 is mounted at one side of the main body and is divided into a cut-in part 61 into which the juice is introduced, and a crushing part 62 for crushing and squeezing the juice.

The juice roller part 30 is mounted inside the housing 20 and rotates by the RPM transmitted from the motor to crush and move the juice.

The juice bottle 40 is mounted on the crushing part 62 of the housing 20 to surround the front end portion of the juice roller part 30, thus crushing and squeezing the juice by interlocking with the juice roller part 30.

The discharge passage 29 is formed on the lower portion of the housing 20 and is formed to be extended from the cut-in part 61 to the crushing part 62. The discharge passage 29 becomes a passage for discharging the juice that is remained in the cut-in part 61 to the outside via the crushing part 62.

The housing cap 50 is detachably mounted on the front end portion of the housing 20, and the debris is discharged to the outside.

Figure 2:
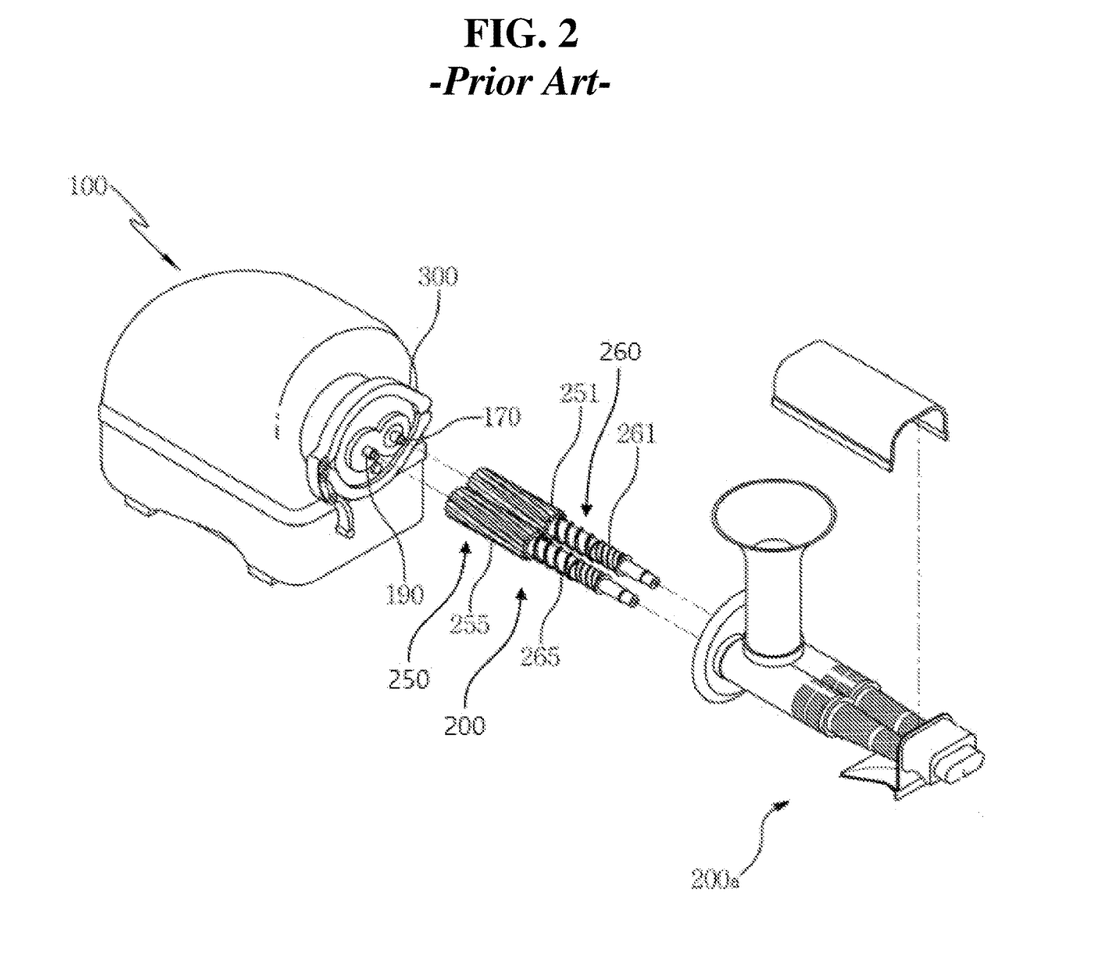
FIG. 2 is an exploded perspective diagram illustrating a conventional two-gear type juicer.
Figure 3:
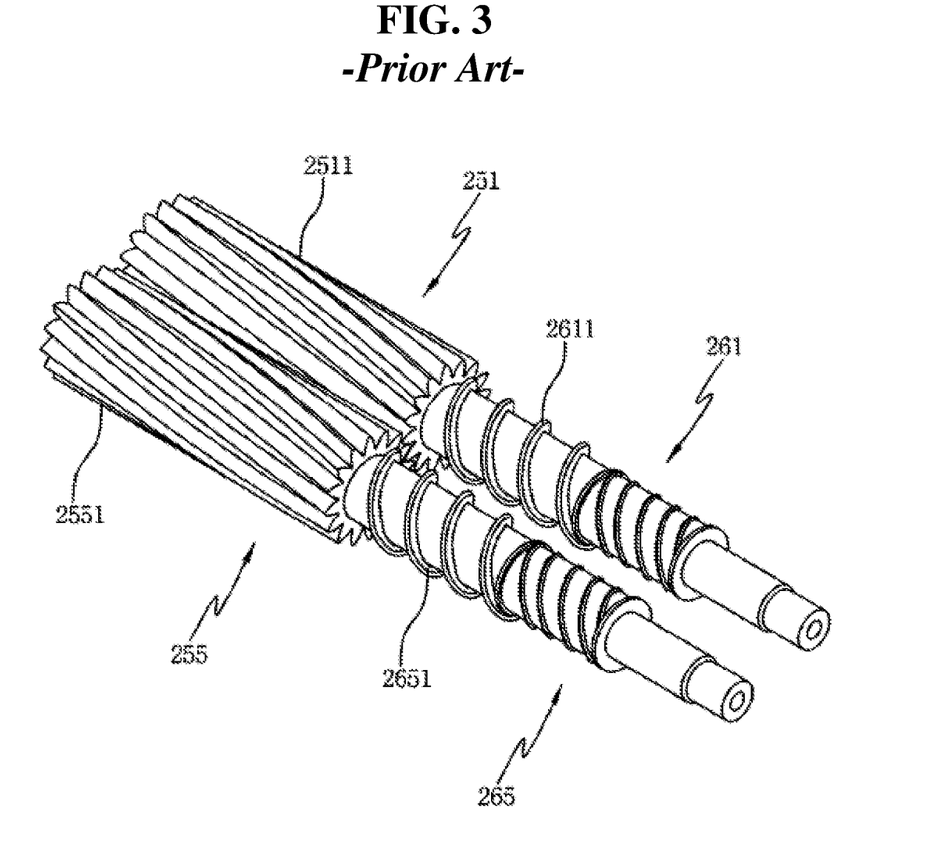
FIG. 3 is a perspective diagram illustrating a crushing roller part and a juice roller part of FIG. 2.

As illustrated in FIGS. 2 and 3, a conventional twin-gear type juicer is composed of a driving part 100 for driving a juice part, and the juice part 200 detachably coupled by a fastening part 300 to crush, pressurize, and transfer the juice and extracting the juice.

The driving part 100 is provided with a motor, and is configured to include a rotating shaft 170 connected to the motor and having one end portion protruded to one side of the motor housing and a fixing shaft 190 disposed parallel to the rotating shaft 170.

The juice part 200 is composed of a crushing roller part 250 rotatably coupled to the driving part 100, a juice roller part 260 formed to be extended to reduce in diameter toward the front from the crushing roller part 250, and a housing 200a for receiving the crushing roller part 250 and the juice roller part 260 and is coupled to the driving part 100.

The crushing roller part 250 is composed of a first crushing roller 251 having a first crushing blade 2511 formed on the outer circumferential surface thereof, and a second crushing roller 255 having a second crushing blade 2551 formed on the outer circumferential surface thereof and provided so as to cross the first crushing blade 2511 and the second crushing blade 2551.

The juice roller part 260 is composed of a first juice roller 261 having a first juice blade 2611 formed on the outer circumferential surface thereof to be tapered so as to reduce in diameter toward the longitudinal front thereof and having the rear end portion coupled to the front end portion of the first crushing roller 251, and a second juice roller 265 having a second juice blade 2651 formed on the outer circumferential surface thereof to be tapered so as to reduce in diameter toward the longitudinal front thereof and having the rear end portion coupled to the front end portion of the second crushing roller 255.

The first crushing blade 2511 and the second crushing blade 2551 have a helical gear shape, and the first juice blade 2611 and the second juice blade 2651 have a spiral shape.

The first crushing roller 251 is coupled to the rotating shaft 170 to rotate integrally with the rotating shaft 170, and the second crushing roller 255 is rotatably coupled to the fixing shaft 190. The second crushing roller 255 is idle-rotatably coupled to the fixing shaft 190.

Since the first juice roller 261 and the second juice roller 265 are coupled to the first crushing roller 251 and the second crushing roller 255, respectively, the first juice roller 261 and the second juice roller 265 also rotate when the first crushing roller 251 and the second crushing roller 255 rotate.

The conventional juicer had a problem in that the juice was not sufficiently pressurized between the housing and the juice roller part, thus reducing juicing efficiency.

SUMMARY

The present disclosure is intended to solve the problem, and an object of the present disclosure is to provide a juicer having improved juicing performance by sufficiently pressurizing the juice between a screw housing and a driving screw by using the piezoelectric effect of the piezoelectric element.

A juicer having improved juicing performance of the present disclosure provides the juicer having improved juicing performance including a housing in which a motor is built in, a driving shaft exposed to one side of the housing and rotatably driven by the motor, a driving screw coupled to the driving shaft to rotate integrally with the driving shaft and received in a screw housing, and the hollow screw housing detachably coupled to the housing and having a hopper provided therein; the driving screw includes a driving screw main body in which an installation groove opened toward the housing is formed, one or more piezoelectric element provided in the installation groove of the driving screw main body, and a contact terminal electrically connected to the piezoelectric element and for electrically contacting a contact electrode provided in the housing; and the contact electrode is provided in the housing.

As described above, the driving screw further includes a support body inserted into the installation groove to be coupled to rotate integrally with the driving screw main body, the longitudinal inside end portion of the support body is spaced apart from the inside end portion of the installation groove to form an installation space between the longitudinal inside end portion of the support body and the inside end portion of the installation groove, and the piezoelectric element is provided in the installation space; and the outside end portion toward the housing of the support body is formed with a coupling part coupled to the driving shaft, a guide passage extended in the longitudinal direction of the driving screw main body is interposed between the outer surface of the support body and the installation groove to provide an electric wire along the guide passage, and the electric wire has one end connected to the piezoelectric element and has the other end connected to the contact terminal.

As described above, the driving screw further comprises a support body inserted into the installation groove to be coupled to rotate integrally with the driving screw main body, an installation space is laterally interposed between a part of the inside end portion of the support body and the installation groove, such that the piezoelectric element is provided in the installation space; and the support body has a coupling part coupled to the driving shaft formed on the end portion toward the housing, a guide passage is interposed between the outer surface of the support body and the installation groove in the longitudinal direction of the driving screw main body; and an electric wire is provided along the guide passage, and the electric wire has one end connected to the piezoelectric element and has the other end connected to the contact terminal.

As described above, a contact electrode insertion part that is a space opened to the axial outside thereof and has a ring-shaped cross section is interposed between the support body and the driving screw main body on the longitudinal outside end portion thereof, and the contact electrodes have an arc-shaped cross section, face each other, and have a part protruded and extended from the housing so that the protruded portion of the contact electrode is rotatably inserted into the contact electrode insertion part.

As described above, the contact terminal is coupled to the outside end portion of the support body so as to dispose at the inside of the contact electrode.

As described above, the installation groove forms an installation groove step part longitudinally and outwardly on the longitudinal outside end portion thereof and has an extension part having a cylindrical-shaped extended inner surface; a part of the longitudinal outside end portion of the support body is formed in a shape facing the extension part and having a circular cross section with a diameter smaller than that of the extension part, such that the contact electrode insertion part is interposed between the part of the longitudinal outside end portion and the extension part, such that the inside end portion of the contact electrode inserted into the contact electrode insertion part faces the installation groove step part.

As described above, a recess contact terminal installation part, which is spaced apart from the installation groove step part to the longitudinal outside thereof and is spaced apart from the longitudinal outside end portion of the support body to the longitudinal inside thereof, is formed on the outer surface of the support body, and the contact terminal is provided in the contact terminal installation part to face the inner surface of the contact electrode.

As described above, the installation space is interposed between the support body and the installation groove in a shape having a ring-shaped cross section and extended in the longitudinal direction thereof, and the piezoelectric element is formed in an arc-shaped cross section, such that the arc-shaped outer surface thereof is installed to face and contact the inner space of the installation groove in the ring-shaped installation space.

As described above, the two installation spaces are formed to face each other between the support body and the installation groove in a shape having an arc-shaped cross section and extended in the longitudinal direction thereof, and the piezoelectric element is formed to have an arc-shaped cross section to be provided in the installation space, respectively to face each other, and the arc-shaped outer surface thereof is installed to face and contact the inner surface of the installation groove.

As described above, the installation space is interposed between the support body and the installation groove in a shape having a circular cross section and extended in the longitudinal direction thereof, and the piezoelectric element is formed in a shape having an arc-shaped cross section and extended in the longitudinal direction thereof to be provided in the installation space, respectively, such that the arc-shaped outer surface thereof is installed to face and contact the inner space of the installation groove.

As described above, the piezoelectric element is formed in plural so as to have both side end portions in the width direction provided to face each other and spaced apart from each other; an auxiliary support body is provided inside the piezoelectric element; the auxiliary support body includes an auxiliary support main body having a circular cross section and interposed between the piezoelectric elements so as to have the outer surface contact the inner surface of the piezoelectric element, and an auxiliary support extension part radially extended outwardly from the auxiliary support main body to interpose between the piezoelectric elements spaced apart from each other.

As described above, the housing further includes a stop shaft exposed to one side of the housing in parallel with the driving shaft and further includes a driven screw rotatably coupled to the stop shaft, and the driven screw is received in the screw housing together with the driving screw; the driving screw main body of the driving screw coupled to the driving shaft includes a crushing part having a helical gear formed on the outer surface thereof and a pressurizing part connected to the crushing part and having a spiral protrusion formed on the outer surface thereof; the driven screw coupled to the stop shaft includes a driven screw main body in which an installation groove opened toward the housing is formed, one or more piezoelectric elements provided in the installation groove of the driven screw main body, and a contact terminal electrically connected to the piezoelectric element and electrically contacting the contact electrode provided in the housing; and the housing further includes the contact electrode electrically communicated with the contact terminal of the driven screw coupled to the stop shaft.

The juicer having improved juicing performance according to the present disclosure may improve juicing performance by sufficiently pressurizing the juice between the screw housing and the driving screw by the piezoelectric effect of the piezoelectric element.

DETAILED DESCRIPTION

Hereinafter, a juicer having improved juicing performance will be described in detail with reference to the accompanying drawings.

Figure 4:
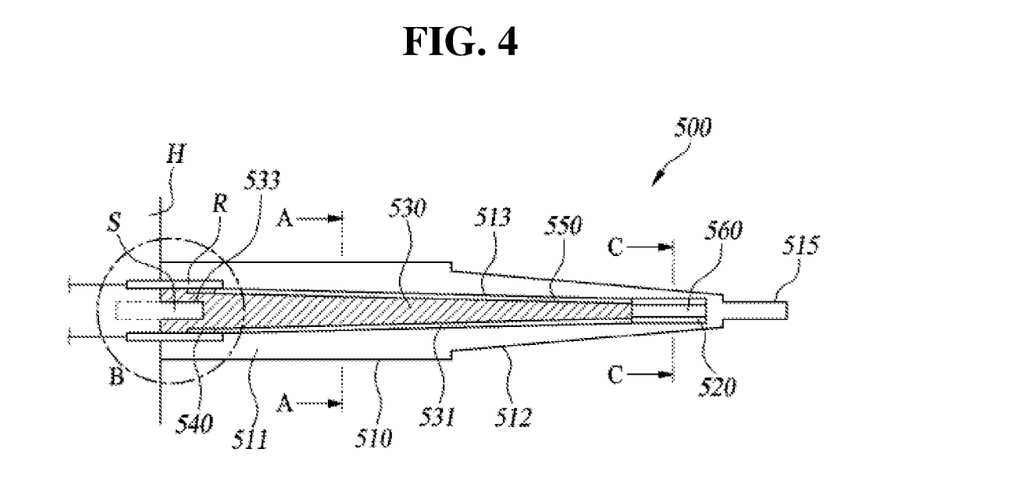
FIG. 4 is a cross-sectional diagram schematically illustrating a driving screw of the juicer according to the present disclosure.
Figure 5:
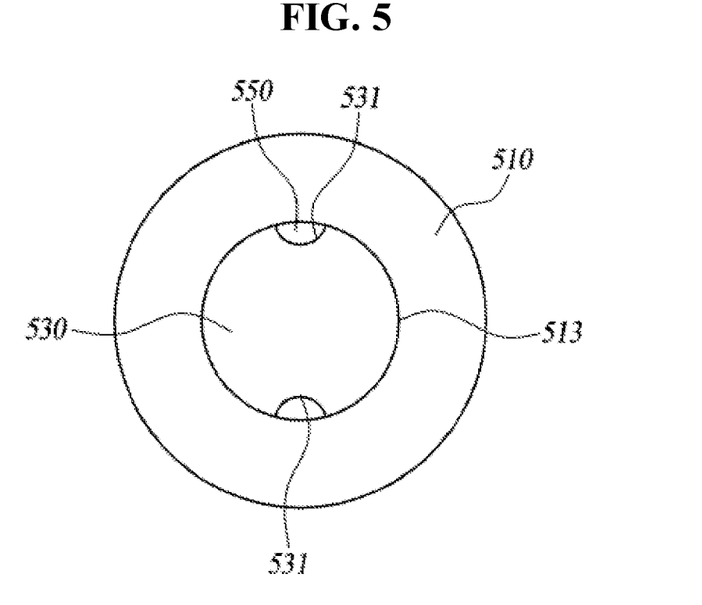
FIG. 5 is a cross-sectional diagram illustrating the cross section of line A-A portion of FIG. 4.
Figure 6:
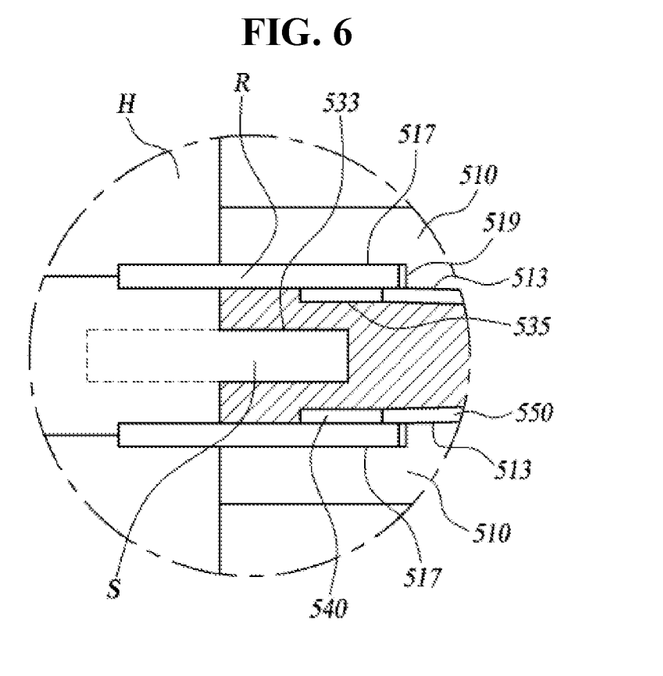
FIG. 6 is an enlarged cross-sectional diagram illustrating the portion B of FIG. 4.
Figure 7:
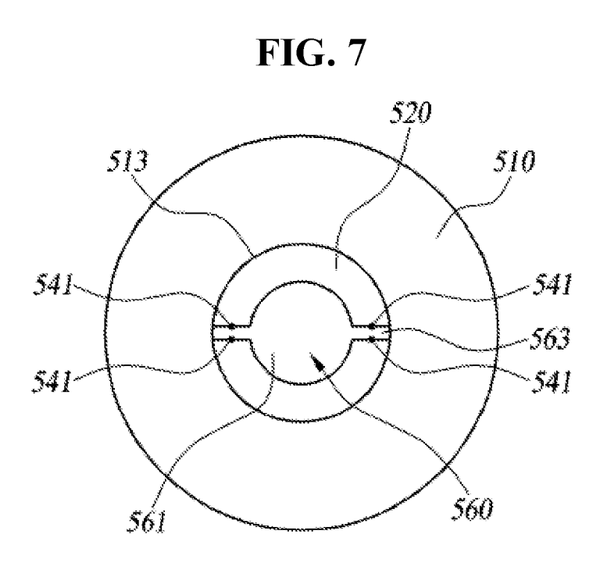
FIG. 7 is a cross-sectional diagram illustrating the cross section of line C-C portion of FIG. 4.
Figure 8:
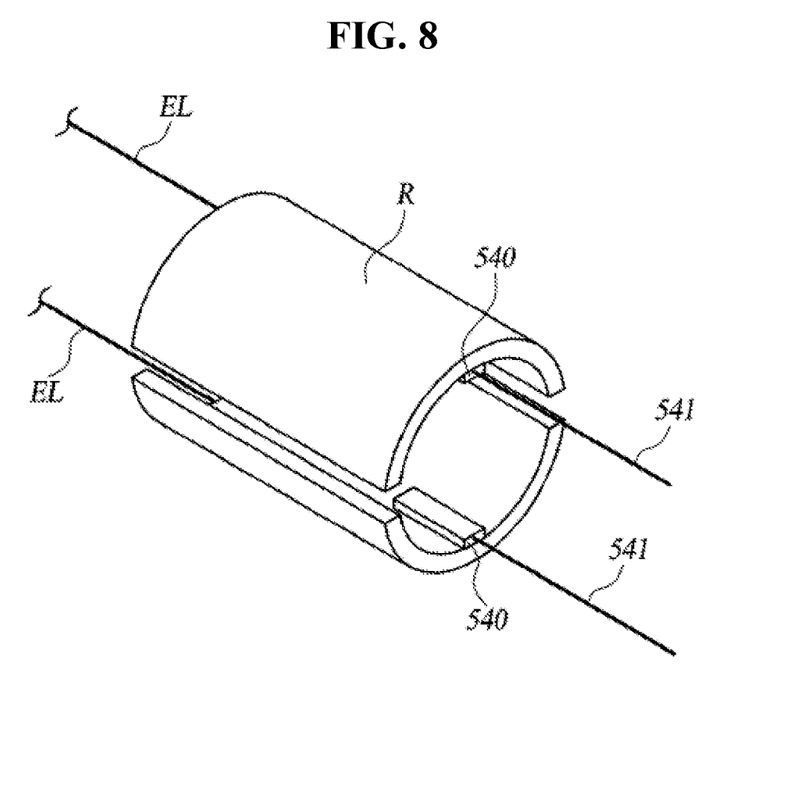
FIG. 8 is a perspective diagram illustrating a contact electrode of the juicer according to the present disclosure.
Figure 9:
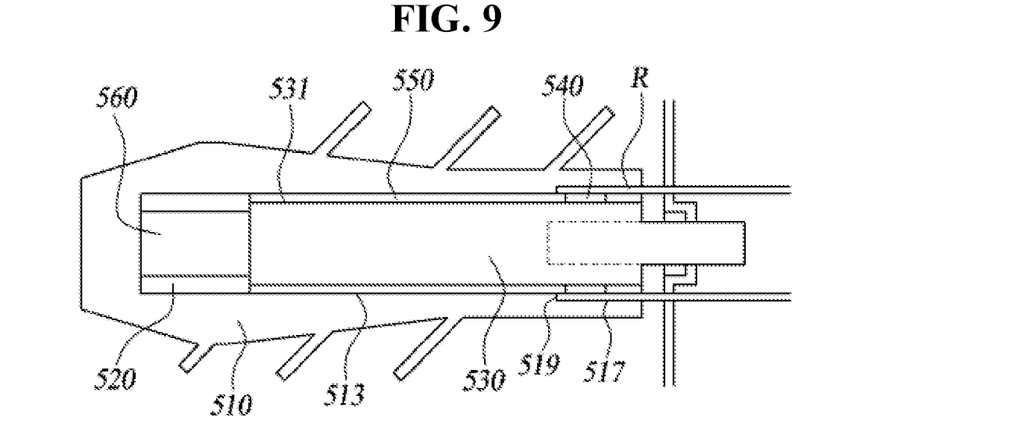
FIG. 9 is cross-sectional diagram illustrating a modification example of the juicer according to the present disclosure.

FIG. 3 is a perspective diagram illustrating a crushing roller part and a juice roller part of FIG. 2, FIG. 4 is a cross-sectional diagram schematically illustrating a driving screw of the juicer according to the present disclosure, FIG. 5 is a cross-sectional diagram illustrating the cross section of line A-A portion of FIG. 4, FIG. 6 is an enlarged cross-sectional diagram illustrating the portion B of FIG. 4, FIG. 7 is a cross-sectional diagram illustrating the cross section of line C-C portion of FIG. 4, FIG. 8 is a perspective diagram illustrating the contact electrode of the juicer according to the present disclosure, and FIG. 9 is a cross-sectional diagram illustrating a modification example of the juicer according to the present disclosure.

In FIG. 4, the horizontal direction is referred to as "longitudinal direction," the vertical direction is referred to as "lateral," the side toward the housing H, which is the opened side of an installation groove 513, is referred to as "outside," and the opposed side thereof is referred to as "insider."

As illustrated in FIG. 4, the juicer having improved juicing performance according to the present disclosure is composed of a housing H, a driving shaft S, a contact electrode R, a driving screw 500, a screw housing (not illustrated).

The motor is built in the housing H.

The driving shaft S is protruded and exposed to one side of the housing H and is rotationally driven by the motor.

The contact electrode R is partially protruded and extended from the housing H in the longitudinal direction thereof. The contact electrode R is disposed outside the driving shaft S so as to surround the driving shaft S at a position where the driving shaft S is provided. As illustrated in FIG. 8, the contact electrode R has a rod shape having an arc-shaped cross section. The two contact electrodes R are provided so as to face each other. Both end portions in the width direction of the contact electrodes R facing each other are spaced apart from each other. The extending line of the arc of the two contact electrodes R is formed to be circular. The contact electrode R is electrically connected to external power by a wire EL.

The driving screw 500 is coupled to the driving shaft S to be rotatable integrally with the driving shaft S. The driving screw 500 is received in the screw housing.

The screw housing is a hollow body and is detachably coupled to the housing H. A hopper is provided on the upper portion of the screw housing, and the juice is injected into the screw housing through the hopper.

As illustrated in FIG. 4, the driving screw 500 is composed of a driving screw main body 510, a support body 530, a piezoelectric element 520, and a contact terminal 540.

The driving screw main body 510 is extended in the longitudinal direction thereof and is a hollow body having a circular cross section. The driving screw main body 510 is composed of a crushing part 511, a pressurizing part 512, and a support part 515, and an installation groove 513 opened toward the housing H is formed therein.

The crushing part 511 is rotatably coupled to the housing H. The crushing part 511 has a cylindrical shape. The outer surface of the crushing part 511 is formed in a helical gear shape.

The pressurizing part 512 is provided in the crushing part 511 in the longitudinal direction thereof. The pressurizing part 512 is formed to be extended from the crushing part 511 so as to reduce in diameter toward the longitudinal inside thereof. The pressurizing part 512 is formed in a tapered shape so as to reduce in diameter toward the longitudinal inside thereof. The outer surface of the pressurizing part 512 is formed in a shape formed with spiral protrusion.

As illustrated in FIG. 9, when the driving screw main body 510 is not separated by the crushing part 511 and the pressurizing part 512, the outer surface of the driving screw main body 510 may be formed in a helical gear shape or a shape formed with spiral protrusion.

The support part 515 is provided in the pressurizing part 512 in the longitudinal direction thereof. The support part 515 is protruded from the longitudinal inside end portion of the pressurizing part 512. The support part 515 is received in the screw housing and prevents deviation of the driving screw 500.

The installation groove 513 is formed in the driving screw main body 510 so as to be opened toward the housing H. The installation groove 513 is formed to be extended in the longitudinal direction thereof. The installation groove 513 may also be formed in a tapered shape so as to reduce in diameter toward the longitudinal inside thereof. The installation groove 513 is extended in the longitudinal direction to be formed so that the crushing part 511 and the pressurizing part 512 are connected to each other.

An installation groove step part 519 is formed on the longitudinal outside end portion of the installation groove 513. The installation groove step part 519 is formed outwardly in the longitudinal direction thereof. The installation groove step part 519 is extensively formed on the longitudinal outside end portion of the installation groove 513, such that an extension part 517 having a cylindrical type inner surface is formed thereon.

The support body 530 is made of synthetic resin (e.g., plastic). The support body 530 is inserted into the installation groove 513 of the driving screw main body 510 and is coupled to rotate integrally with the driving screw main body 510. The support body 530 has a rod shape having a circular cross section. The support body 530 is extended in the longitudinal direction thereof. The support body 530 may also be formed in a tapered shape so as to reduce in diameter toward the longitudinal inside thereof.

The support body 530 is coupled with the installation groove 513 in a forcibly-fitting manner. The support body 530 may also have at least a part of the outer surface bonded and coupled to the installation groove 513 with an adhesive agent. In addition, a male screw is formed on a part of the outer surface of the support body 530, and a female screw is formed on a part of the inner surface of the installation groove 513 to be screwed and it may also be coupled to the installation groove 513.

The support body 530 has the longitudinal inside end portion spaced apart from the longitudinal inside end portion of the installation groove 513. An installation space (not illustrated) is interposed between the longitudinal inside end portion of the support body 530 and the inside end portion of the installation groove 513.

A part of the longitudinal outside end portion of the support body 530 is provided to face the extension part 517.

The longitudinal outside end portion of the support body 530 is formed to have a smaller diameter than that of the extension part 517.

A contact electrode insertion part is interposed between a part of the longitudinal outside end portion of the support body 530, the extension part 517, and the installation groove step part 519. The contact electrode insertion part is axially opened outwardly and is formed as a space having an annular cross section. The protruded portion of the contact electrode R is rotatably inserted into the contact electrode insertion part. The inside end portion of the contact electrode R inserted into the contact electrode insertion part is provided to face the installation groove step part 519.

The support body 530 is formed with a guide groove 531, a coupling part 533, and a contact terminal installation part 535.

As illustrated in FIG. 5, the guide groove 531 is recessed at the side of the support body 530. The guide groove 531 is formed to be extended along the longitudinal direction of the support body 530. The guide groove 531 formed in plural. The guide grooves 531 are spaced apart from each other along the circumferential direction of the support body 530.

A guide passage 550 is interposed between the guide groove 531 and the installation groove 513 in the longitudinal direction of the driving screw main body 510. The guide passage 550 communicates with the longitudinal inside of the installation space.

As illustrated in FIG. 6, the coupling part 533 is recessed on the longitudinal outside end portion of the support body 530. The driving shaft S is inserted into and coupled to the coupling part 533. The coupling part 533 is convexly formed in the longitudinal direction thereof and the housing H is recessed on the position where the driving shaft S is provided, such that the coupling part 533 may also be inserted into and coupled to the housing H.

The contact terminal installation part 535 is formed to be inwardly and longitudinally spaced apart from the longitudinal outside end portion of the support body 530. The contact terminal installation part 535 is formed to be outwardly and longitudinally spaced apart from the installation groove step part 519 formed on the longitudinal outside of the installation groove 513. The contact terminal installation part 535 is interposed between the longitudinal outside end portion of the support body 530 and the installation groove step part 519.

The contact terminal installation part 535 is recessed on the outer surface of the support body 530. The contact terminal installation part 535 is formed to communicate with the guide groove 531. The contact terminal 540 is disposed on the contact terminal installation part 535.

As illustrated in FIG. 7, the piezoelectric element 520 is provided in an installation space between the longitudinal inside end portion of the support body 530 and the inside end portion of the installation groove 513. The installation space is formed in a shape having a circular cross section and extended in the longitudinal direction thereof.

The piezoelectric element 520 is formed in a shape having an arc-shaped cross section and extended in the longitudinal direction thereof. One or more piezoelectric elements 520 are provided. When two or more piezoelectric elements 520 are provided, the width-directional opposite ends of the adjacent piezoelectric elements 520 face each other and are spaced apart from each other. The extension line of the arc of the piezoelectric element 520 is formed to have a circular shape.

The longitudinal outside end portion of the piezoelectric element 520 faces the longitudinally inside end portion of the support body 530, and the longitudinal inside end portion of the piezoelectric element 520 faces the inside end portion of the installation groove 513. The outer surface of the piezoelectric element 520 is provided to face and contact the inner surface of the installation groove 513.

An auxiliary support body 560 is further provided in the installation space.

The auxiliary support body 560 is provided inside the piezoelectric element 520. The longitudinal outside end portion of the auxiliary support body 560 faces the longitudinally inside end portion of the support body 530, and the longitudinal inside end portion of the auxiliary support body 560 faces the inside end portion of the installation groove 513. The material of the auxiliary support body 560 is made of synthetic resin such as plastic. The auxiliary support body 560 may also be connected to the longitudinal inside end portion of the support body 530 to be integrally provided.

The auxiliary support body 560 is composed of an auxiliary support main body part 561 and an auxiliary support extension part 563.

The auxiliary support main body part 561 is formed in a cylindrical shape having a circular cross section. The auxiliary support main body part 561 is interposed between the piezoelectric elements 520 so that the outer surface thereof faces and contacts the inner surface of the piezoelectric element 520.

When the auxiliary support body 560 is formed only of the auxiliary support main body part 561, the installation space has a ring-shaped cross section and is formed to be extended in the longitudinal direction thereof.

The auxiliary support extension part 563 is formed to be radially extended outwardly from the auxiliary support main body part 561. The auxiliary support extension part 563 is interposed between the piezoelectric elements 520 spaced apart from each other.

The auxiliary support body 560 is provided, such that the installation space is interposed laterally between a part of the inside end portion of the support body 530 and the installation groove 513. The installation space has an arc-shaped cross section and is formed to be extended in the longitudinal direction thereof so that two face each other. The piezoelectric element 520 is provided in the installation spaces having an arc-shaped cross section, respectively.

The piezoelectric element 520 is connected to the piezoelectric element 520 through an electric wire 541, such that the contact terminal 540 provided on the other side of the wire 541 electrically contacts and electrically connected to the contact electrode R.

The electric wire 541 is extended in the longitudinal direction thereof, and is provided along the guide passage 550 interposed between the guide groove 531 and the installation groove 513. One end of the electric wire 541 is connected to the piezoelectric element 520, and the other end of the electric wire 541 is connected to the contact terminal 540.

The contact terminal 540 is provided on the contact terminal installation part 535 of the support body 530. The contact terminal 540 is provided on the contact terminal installation part 535 to face the inner surface of the contact electrode. The contact terminal 540 is made of a brush. Conversely, the contact electrode R may also be made of a brush.

When the juicer having improved juicing performance according to the present disclosure is a twin gear type, a stop shaft and a driven screw (not illustrated) are further provided, and the driven screw is received in the screw housing together with the driving screw 500.

The stop shaft is provided in the housing H in parallel with the driving shaft S. The stop shaft is exposed to one side of the housing H. A contact electrode is provided around the stop shaft.

The driven screw is formed in the same manner as the driving screw 500. The driven screw is idle-rotatably coupled to the stop shaft.

The driven screw is composed of a driven screw main body, a support body, a piezoelectric element, and a contact terminal.

An installation groove opened toward the housing H is formed in the driven screw main body. The installation groove of the driven screw main body is provided with the support body, and the piezoelectric element is interposed between the longitudinal inside end portion of the support body and the longitudinal inside end portion of the installation groove. The piezoelectric element is connected to the piezoelectric element through an electric wire, such that the contact terminal provided at the other side of the electric wire electrically contacts and is electrically connected to the contact electrode.

The contact electrode that electrically contacts the contact terminal of the driven screw is disposed outside the stop shaft so as to surround the stop shaft.

The piezoelectric element 520 provided in the juicer according to the present disclosure repeats compression and expansion when an alternating current is applied thereto and mechanical vibration occurs, thus generating an ultrasonic wave.

Therefore, the ultrasonic wave is generated from the piezoelectric element 520 provided in the driving screw main body 510 to occur vibration of the driving screw 500, such that the juice is sufficiently pressurized between the screw housing and the driving screw 500, thus improving the juicing performance of the juicer.

As described above, although the juicer having improved juicing performance according to the present disclosure has been described with reference to the embodiments illustrated in the drawings, it is merely an example, and it will be understood by those skilled in the art that various modifications and equivalent other embodiments are possible. Therefore, the true technical protection scope thereof should be determined by the technical spirit of the appended claims.

As described above, the juicer having improved juicing performance according to the present disclosure may sufficiently pressurize the juice between the screw housing and the driving screw by the piezoelectric effect of the piezoelectric element, thus improving juicing performance to increase production efficiency.

The invention claimed is:

1. A juicer having improved juicing performance, comprising:
    a housing in which a motor is built in;
    a screw housing detachably coupled to the housing; and
    a driving screw exposed to one side of the housing and received in the screw housing so as to rotate by being coupled to a driving shaft rotatably driven by the motor,
    wherein the driving screw comprises:
        a driving screw main body including an installation groove formed therein along a longitudinal direction and having an open end facing the housing and a closed end opposite to the open end in the longitudinal direction;
        a support body inserted into the installation groove to be coupled to rotate integrally with the driving screw main body and having a longitudinal distal end facing the closed end inside the installation groove;
        an installation space provided inside the installation groove between the closed end of the installation groove and the longitudinal distal end of the support body which faces the closed end;
        an auxiliary support body provided in the installation space and including an auxiliary support main body and auxiliary support extensions protruded from the auxiliary support main body in a radial direction;
        piezoelectric elements provided in the installation space between the closed and the longitudinal distal end to surround the auxiliary support main body and spaced apart from each other by the auxiliary support extensions; and
        contact terminals electrically connected to the piezoelectric elements and electrically contacting contact electrodes provided in the housing.

2. The juicer having improved juicing performance of claim 1, wherein the support body includes an outside end portion facing the housing and being formed with a coupling part coupled to the driving shaft,
    wherein a guide passage extended in the longitudinal direction of the driving screw main body is interposed between an outer surface of the support body and the installation groove and an electric wire is provided along the guide passage, and
    wherein the electric wire has one end connected to one of the piezoelectric elements and has another end connected to one of the contact terminals.

3. The juicer having improved juicing performance of claim 1, wherein a contact electrode insertion part that is a space axially opened at the open end and having a ring-shaped cross section is interposed between the support body and the driving screw main body, and
    wherein each of the contact electrodes has an arc-shaped cross section, faces each other, and has a part protruded and extended from the housing, and the part protruded and extended from the housing is rotatably inserted into the contact electrode insertion part.

4. The juicer having improved juicing performance of claim 3, wherein the contact terminals are coupled to the open end of the support body so as to dispose on insides of the contact electrodes.

5. The juicer having improved juicing performance of claim 1, wherein the installation space is interposed between the support body and the installation groove in a shape having a ring-shaped cross section and extended in the longitudinal direction, and
    wherein each of the piezoelectric elements is formed to have an arc-shape cross section and is installed so that an arc-shaped outer surface thereof faces and contacts an inner surface of the installation groove in the installation space.

6. The juicer having improved juicing performance of claim 1, wherein the installation space is interposed between the support body and the installation groove in a shape having a circular cross section and extended in the longitudinal direction, and
    wherein each of the piezoelectric elements is formed in a shape having an arc-shape cross section and extended in the longitudinal direction and is provided in the installation space to be installed so that an arc-shaped outer surface thereof faces and contacts an inner surface of the installation groove.

7. The juicer having improved juicing performance of claim 1, wherein the driving screw further comprises:

a crushing part in which a helical gear is formed on an outer surface of the driving screw main body; and a pressurizing part connected to the crushing part and having a spiral protrusion formed on an outer surface thereof.

* * * * *